(12) United States Patent
Siniscalchi et al.

(10) Patent No.: US 8,115,345 B2
(45) Date of Patent: Feb. 14, 2012

(54) VARIABLE TIMING SWITCHING SYSTEM AND METHOD

(75) Inventors: Patrick Peter Siniscalchi, Murphy, TX (US); Richard Knight Hester, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 318 days.

(21) Appl. No.: 12/568,265

(22) Filed: Sep. 28, 2009

(65) Prior Publication Data

US 2011/0074223 A1 Mar. 31, 2011

(51) Int. Cl.
*H03K 17/00* (2006.01)
(52) U.S. Cl. .......................... 307/115; 307/125; 307/126
(58) Field of Classification Search .................. 307/115, 307/125, 126
See application file for complete search history.

(56) References Cited

U.S. PATENT DOCUMENTS

| | | | | |
|---|---|---|---|---|
| 4,215,277 A * | 7/1980 | Weiner et al. | ................... | 307/41 |
| 4,286,516 A * | 9/1981 | Wertanen | ................... | 101/93.03 |
| 5,164,875 A * | 11/1992 | Haun et al. | ....................... | 361/64 |
| 5,300,864 A * | 4/1994 | Allen, Jr. | ....................... | 315/314 |
| 5,654,592 A * | 8/1997 | Butler et al. | ................... | 307/80 |
| 2009/0115256 A1* | 5/2009 | Flynn et al. | ................... | 307/115 |
| 2011/0018362 A1* | 1/2011 | Jaeckle | ........................ | 307/115 |
| 2011/0187202 A1* | 8/2011 | Chuang et al. | ................ | 307/115 |

* cited by examiner

*Primary Examiner* — Fritz M Fleming
(74) *Attorney, Agent, or Firm* — John J. Patti; Wade J. Brady, III; Frederick J. Telecky, Jr.

(57) ABSTRACT

A low-EMI switched circuit comprises two or more switches, wherein impedance transitions of the switches are overlapped and the overlap is varied using variable switch timing based on an output power level of the switched circuit. The variable timing results in a variable impedance overlap between the switches. In one example, when one switch turns off (begins a low to high impedance transition) and a second switch turns on (begins a high to low impedance transition), a greater timing delay in beginning the second switch's transition results in a higher switch impedance overlap than a shorter delay does. If the variable timing is based on output power of the switched circuit, the variable delay can operate to reduce fly-back voltages at high power output levels and reduce shoot-through current at lower power levels, reducing EMI and quiescent current of the switched circuit.

19 Claims, 6 Drawing Sheets

VARIABLE TIMING SWITCHING SYSTEM AND METHOD

TECHNICAL FIELD

This invention relates generally to switching systems, and more particularly to variable timing in switching systems.

BACKGROUND

Low-electromagnetic interference ("EMI") switching systems, or switched circuits, are generally known in the art. These systems employ the use of electronic switches, such as transistors, to rapidly connect and disconnect a load, a power source, a signal, or other electrical circuitry within the system. Often, these systems utilize multiple switches, and often instances exist when one or more switches are to be engaged at a same desired time that one or more other switches are to be disengaged, or visa versa. To cost-effectively control EMI emissions of switching systems, the engaging and disengaging of switches is overlapped using pre-calculated timing in an effort to rid the system of fly-back voltage and shoot-through current without the need for additional external filtering components.

The switch overlap can be realized and controlled by dividing each switch into multiple independently-controlled switches in parallel with varying impedances (essentially creating a composite switch). When these parallel switches are operated sequentially, the impedance transition of the composite switch is slowed. Applying this technique to multiple switches and overlapping transitions can effectually eliminate both fly-back voltage and shoot-through current. Additionally, this decrease in high-frequency energy may help result in lower EMI.

Although effective for a wide range of output power levels, this technique's performance can be less than optimal when the output power falls outside of the effective power range of the pre-calculated timing values. Particularly, if output power is too low, the overlap time may be too long, resulting in excessive shoot-through current. This excessive shoot-through current may dominate the quiescent current of the system as a whole in low power applications where often it is desired to keep quiescent current to a minimum. Conversely, in high output power applications, the overlap may be too short, resulting in fly-back voltage, and thus defeating the desired low-EMI effect of the circuit.

SUMMARY

Generally speaking, pursuant to these various examples, the timing of switch operation in a switched circuit is controlled. A first and a second switch controller are provided, each having a plurality of outputs by which the first and second switch controllers control operation of at least one switch in a corresponding switch set in the switched circuit. By one approach, the switched circuit can comprise an H-bridge in a class D audio amplifier. Each switch controller is configured to receive a corresponding switch controller control signal and a corresponding timing signal by which the switch controller, according to a function of these signals, controls operation of at least one switch in its corresponding switch set via its outputs. By one approach, the first and/or the second switch controllers are configured to control operation of their corresponding switch sets in a sequence.

A first and a second circuit are also provided. By one approach, these first and second circuits comprise multiplexers. The first circuit is configured to receive at least one of the second switch controller outputs and a control signal; the second circuit is configured to receive at least one of the first switch controller outputs and the control signal. By one approach, the control signal reflects a power level of operation for the switched circuit. The first circuit is further configured to provide the first timing signal according to a function of the control signal such that the first timing signal is determined by the first circuit in response to at least one of the second switch controller outputs. Similarly, the second circuit is further configured to provide the second timing signal according to a function of the control signal such that the second timing signal is determined by the second circuit in response to at least one of the first switch controller outputs.

By one example, a third switch controller is provided having a plurality of outputs by which the third switch controller controls operation of at least one switch in a third switch set in the switched circuit via at least one of the third switch controller outputs, and the third switch controller is configured to operate the third switch set in a sequence. By another approach, the third switch controller is configured to receive a third switch controller control signal and at least one of the first or second timing signals and is configured to control operation of the at least one switch of the third switch set according to a function of the at least one of the first or second timing signals and the third switch controller control signal.

So configured, these teachings provide great flexibility with respect to the use of low-EMI switched circuits over a wide range of power outputs, and further provide increased scalability of low-EMI switched circuits for use with various output power levels, desired timing granularity, and output load characteristics. Due to this scalability, these teachings can provide for increased power efficiency, leading to less overall power consumption and increased battery life. Other benefits include decreased design time, elimination of additional components, and scalable part selection. For example, a design engineer can utilize these teachings to eliminate external components, pass EMI requirements, and readily utilize a familiar system over a wide range of design requirements, delivering both a cost savings and time savings to design projects and end product delivery.

These and other benefits may become clearer upon making a thorough review and study of the following detailed description.

BRIEF DESCRIPTION OF THE DRAWINGS

The above needs are at least partially met through provision of the variable timing switching systems and methods described in the following detailed description, particularly when studied in conjunction with the drawings, wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
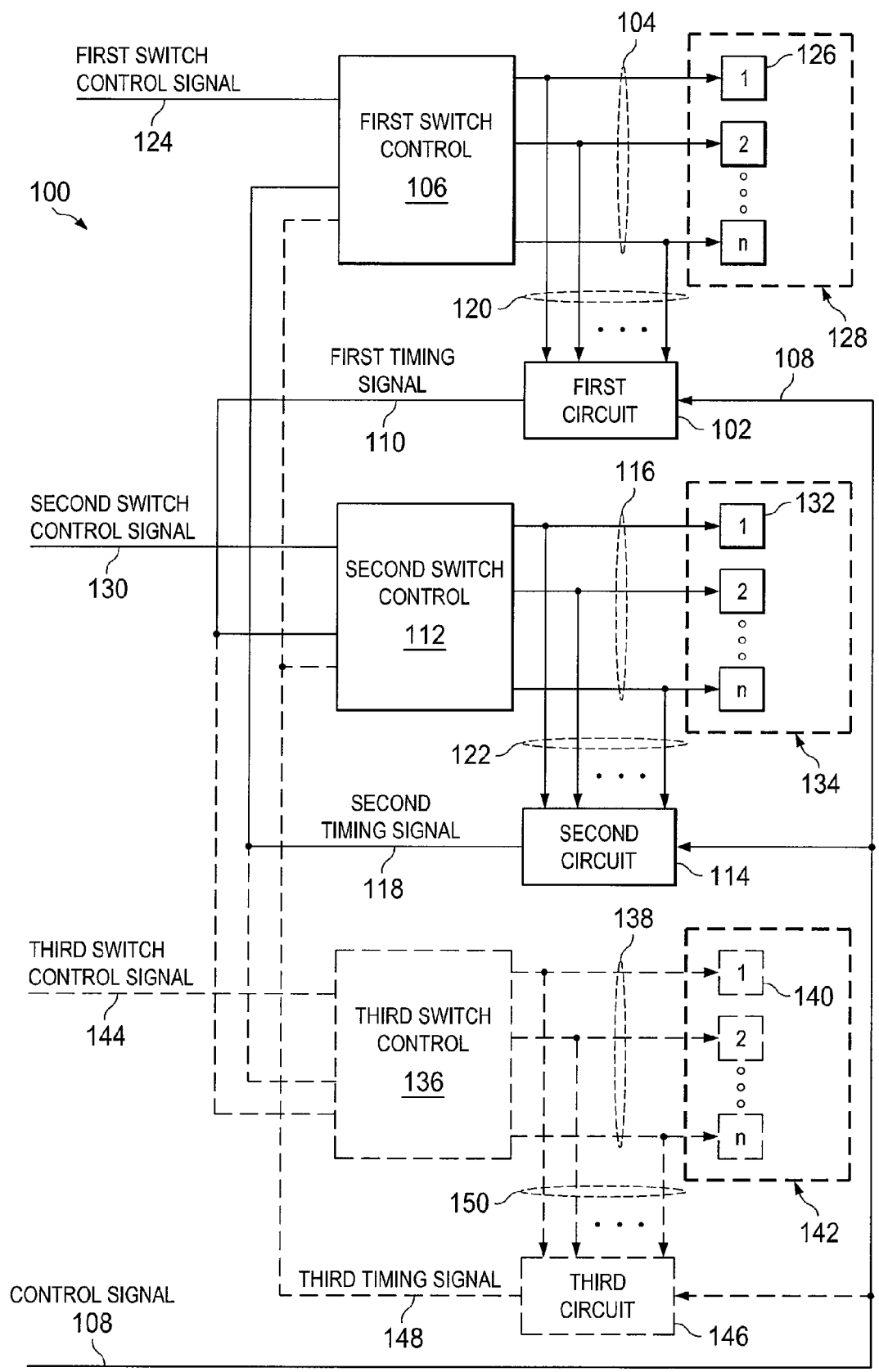
FIG. 1 comprises a block diagram of an example switching circuit as configured in accordance with various embodiments of the invention.

Referring now to the drawings, and particularly to FIG. 1, an illustrative example of an apparatus for controlling timing of switch operation in a switched circuit 100 is provided. The apparatus 100 includes a first circuit 102 coupled to at least one output 104 of a first switch controller 106 and configured to receive a control signal 108, to provide a first timing signal 110 to a second switch controller 112. By this example, the first timing signal 110 is provided according to a function of the control signal 108 such that the first timing signal 110 is determined in response to at least one of the first switch controller outputs 104. In another example, the first timing signal 110 is determined in response an inverted form of at least one of the first switch controller outputs 104.

The apparatus 100 also includes a second circuit 114 coupled to at least one output 116 of the second switch controller 112 and configured to receive the control signal 108 to provide a second timing signal 118 to the first switch controller 106. The second timing signal 118 is provided according to a function of the control signal 108 such that the second timing signal 118 is determined in response to at least one of the second switch controller outputs 116. In another example, the second timing signal 118 is determined in response an inverted form of at least one of the second switch controller outputs 116.

In one example, the first circuit 102 further comprises a first multiplexer, which are readily known in the art, having a plurality of first multiplexer inputs 120, at least one of the first multiplexer inputs 120 being coupled to at least one of the first switch controller outputs 104. In this example, the first timing signal 110 is provided from one of the first multiplexer inputs 120 according to the control signal 108. In another example, the second circuit 114 further comprises a second multiplexer having a plurality of second multiplexer inputs 122, at least one of the second multiplexer inputs 122 being coupled to at least one of the second switch controller outputs 116. The second timing signal 118 is provided from one of the second multiplexer inputs 122 according to the control signal 108. Those skilled in the art will appreciate that the functionality of the above-described first and second circuits may be implemented via any number of known methods and technologies in the art, including, but not limited to, multiplexers, individual or combinatory logic gates, and wholly or partially programmable components.

Referring again to the apparatus 100 in FIG. 1, by one example, the first switch controller 106, having a plurality of first switch controller outputs 104, is configured to receive a first switch controller control signal 124 and the second timing signal 118. The first switch controller 106 is further configured to control at least one switch 126 of a first switch set 128 according to a function of the first switch controller control signal 124 and the second timing signal 118 via at least one of the first switch controller outputs 104. The first switch controller 106 may optionally be configured to operate the first set of switches 128 in a sequence.

Similarly, by another example, the second switch controller 112, having a plurality of second switch controller outputs 116, is configured to receive a second switch controller control signal 130 and the first timing signal 110. The second switch controller 112 is further configured to control at least one switch 132 of a second switch set 134 according to a function of the second switch controller control signal 130 and the first timing signal 110 via at least one of the first switch controller outputs 116. The second switch controller 112 may optionally be configured to operate the second set of switches 134 in a sequence.

In one example, the apparatus 100 also includes a third switch controller 136 that, similar to the first and second switch controllers 106, 112, has a plurality of third switch controller outputs 138 and is configured to control operation of at least one switch 140 of a third switch set 142 via at least one of the third switch controller outputs 138. The third switch controller 136 may be further configured to receive a third switch controller control signal 144 and at least one of the first or second timing signals 110, 118, and to control the at least one switch 140 of the third switch set 142 according to a function of the received signals 110, 118, 144. The third switch controller 136 may optionally be configured to operate the third set of switches 142 in a sequence.

Optionally, the apparatus 100 may also include a third circuit 146 coupled to at least one output 138 of the third switch controller 136, and which receives the control signal 108, whereby the third circuit 146 provides a third timing signal 148 to at least one of the first or second switch controller 106, 112. The third timing signal 148 is provided according to a function of the control signal 108 such that the second timing signal 148 is determined in response to at least one of the third switch controller outputs 138. In another example, the third timing signal 148 is determined in response to an inverted form of at least one of the third switch controller outputs 138, the inversion occurring on the at least one of the third switch controller outputs 138 or on the output of the third circuit 146 to produce the third timing signal 148. In one example, the third circuit 146 further comprises a third multiplexer, which are readily known in the art, having a plurality of third multiplexer inputs 150, at least one of the third multiplexer inputs 150 being coupled to at least one of the third switch controller outputs 138. The third timing signal 148 is then provided from one of the third multiplexer inputs 150 according to the control signal 108.

Figure 2:
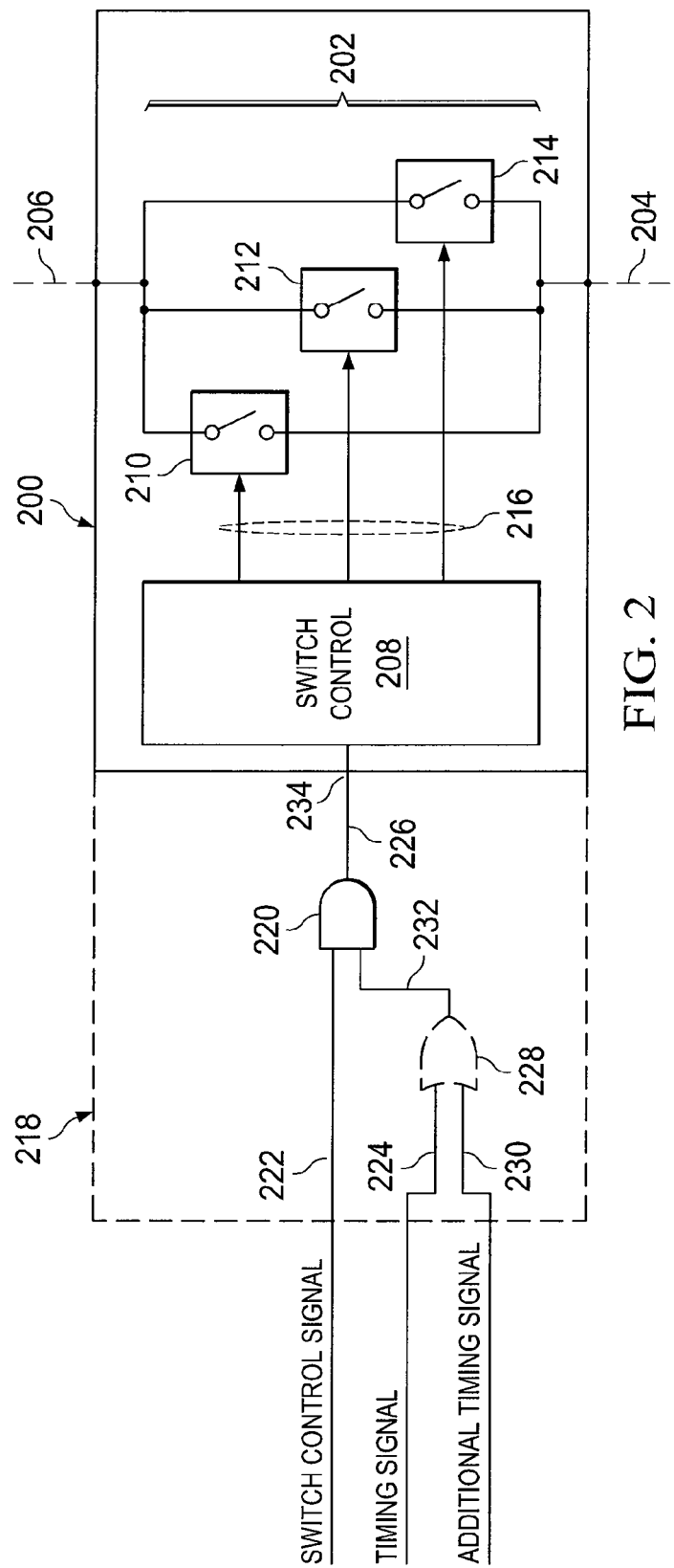
FIG. 2 comprises a block diagram of an example switching circuit as configured in accordance with various embodiments of the invention.

Turning now to FIG. 2, an example of a composite switch 200 is discussed. The composite switch 200 contains a switch set 202 (similar to those shown in FIG. 1), wherein at least some of the switches of the switch set 202 are connected in parallel, with common terminals electrically coupled. Any number of switches may exist in the switch set 202, and the switches of the switch set 202 may comprise BJT, JFET, NMOS, or PMOS transistors (or any other electrical switch as are commonly known in the art) with their sources and drains electrically coupled to provide a single common source 204 and a single common drain 206. The composite switch 200 also contains a switch controller 208 (similar to those shown in FIG. 1) configured to control at least one switch 210, 212, 214 of the switch set 202 via outputs 216. With this configuration, the composite switch 200 and its parallel switch set 202 can be viewed as (and act as) a single unified switch with a single input 234, a single source 204, and a single drain 206.

The switch controller 208, in one example, is configured to operate the switch set 202 in a sequence (i.e., switch 210 engages, then, at a later time, switch 212 engages, et cetera, until lastly, switch 214 engages). The switch set 202, in another example, consists of switches with exponentially increasing impedances, wherein the switch with the highest impedance is engaged first (i.e., switch 210), then the switch with the next highest impedance is engaged second (i.e., switch 212), and so forth. Similarly, and by yet another example, when the composite switch 200 is to transition from closed (engaged) to open (disengaged), the switch with the lowest impedance will be disengaged first (i.e., switch 214), the switch with the next lowest impedance is disengaged second (i.e., switch 212), and so forth. By these examples, one resulting effect is a slowing of the impedance transition of the entire composite switch 200 from open (disengaged) to closed (engaged) and vise-versa, which results in slower voltage transitions on certain nodes of a switched circuit. This may allow for greater controllability of timing of switch transition overlap, as well as reduced high-frequency energy, which may help to reduce EMI. One example of such a composite switch is disclosed in U.S. patent application Ser. No. 12/206,905, filed Sep. 9, 2009, titled Switching System with Reduced EMI, which is incorporated herein by reference.

Referring again to FIG. 2, in one example, a logical gate interface 218 to a switch controller 208 is used to effect, in part, switch operation delay. This logical gate interface 218 may contain a logical AND gate 220, as are known in the art, configured to receive a switch control signal 222 and a timing signal 224 and to provide a timing-influenced switch controller control signal 226 to the switch controller 208. In yet another example, the logical gate interface 218 may also contain a logical OR gate 228 configured to receive the timing signal 224 and an additional timing signal 230, and provide a logical OR output 232 to the AND gate 220. One skilled in the art will recognize that the implementation of the logical gate interface 218 may be achieved through numerous methods and structures as are commonly known in the art. By one example, the logical gate interface 218 functionality and the corresponding timing-influenced switch controller control signal 226 functionality may exist internal to the composite switch 200, or even the switch controller 208, whereby the composite switch 200 or the switch controller 208 itself may directly receive the switch control signal 222 and the timing signal 224 and, in another example, the additional timing signal 230. (This alternative implementation is similar to that depicted in FIG. 1, wherein the first switch controller 106 directly receives the first switch control signal 124 and the second timing signal 118, and optionally, the third timing signal 148.)

By one example, the logical gate interface 218 may be implemented along with, or as part of, any or all of the switch controllers 106, 112, 136 shown in FIG. 1, providing for a first, second, and third AND gate, and optionally, a first, second, and third OR gate. In an example where the switch controller 208 corresponds to the first switch controller 106, the switch control signal 222 may correspond to the first switch control signal 124, and the timing signal 224 and additional timing signal 230 may correspond to the second timing signal 118 and the third timing signal 148. Also, the logical AND gate 220 and the logical OR gate 228 may correspond to a first AND gate and a first OR gate, respectively, and operate to provide a first timing-influenced switch controller control signal (corresponding to the timing-influenced switch controller control signal 226).

By other examples, wherein the switch controller 208 corresponds to the second switch controller 112, the switch control signal 222 may correspond to the second switch control signal 130, and the timing signal 224 and additional timing signal 230 may correspond to the first timing signal 110 and the third timing signal 148; wherein the switch controller 208 corresponds to the third switch controller 136, the switch control signal 222 may correspond to the third switch control signal 144, and the timing signal 224 and additional timing signal 230 may correspond to the first timing signal 110 and the second timing signal 118. Similar to above, these examples will provide respectively for a second and third timing-influenced switch controller control signal. One skilled in the art will recognize that additional switch controllers and corresponding switch sets may added to the switching circuits according to the teachings of this application.

One function of the logical gate interface 218 is to delay the corresponding timing-influenced switch controller control signal 226 to the switch controller 208. By this example, the logical gate interface 218 will assert the timing-influenced switch controller control signal 226 (thus prompting the switch controller 208 to operate at least one switch 210 of a switch set 202) when both the switch control signal 222 and the timing signal 224 or, in an alternate example, the additional timing signal 230, are asserted. By this, the beginning of switch operation can be delayed, resulting in a delayed overlap between impedance transitions of two different switch sets (i.e., between the first switch set 128, and the second switch set 134).

Referring again to FIG. 1, one example is described where the engagement of the first switch set 128 is overlapped (possibly with a delay) with the disengagement of the second switch set 134. This delayed overlap is achieved as the second switch set 134 begins to disengage, and at a later time, but during this disengagement, the first set 128 begins to engage. In this example, the first switch control signal 124 is asserted (indicating a desire to engage the first switch set 128) simultaneously or near simultaneously with the second switch control signal's 130 switching to indicate a desire to disengage the second switch set 134. The second timing signal 118 indicates the that second switch controller 112 is disengaging at least one switch 132 of the second switch set 134 via at least one second switch controller output 116 (the second timing signal 118 possibly existing as an inverted version of the at least one second switch controller output 116). According to these teachings, there may exist a delay between the second switch control signal's 130 ceasing to be asserted and the second switch controller 112 resultantly affecting the at least one second switch controller output 116. The second timing signal 118, provided by the second circuit 114, is determined in response to the at least one second switch controller output 116, and, in turn, the second timing signal 118 will perpetuate this delay. The first switch controller 106, having already sensed the assertion of the first switch control signal 124, will then sense the assertion of the second timing signal 118, and at such time, will begin to engage the first switch set 128. Alternatively, a logical gate interface 218, similar to that of FIG. 2, may sense the first switch control signal 124 and the second timing signal 118 and provide a corresponding timing-influenced switch controller control signal 226 to the first switch controller 106 prompting the first switch controller 106 to engage the first switch set 128.

Figure 3:
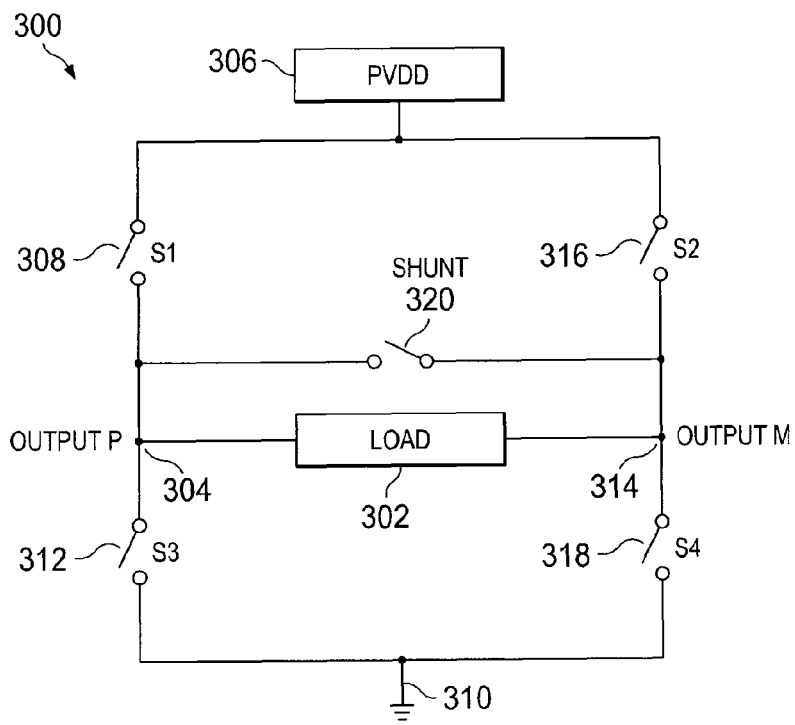
FIG. 3 comprises a schematic diagram of an example switching circuit as configured in accordance with various embodiments of the invention.

Referring now to FIG. 3, an example implementation of these teachings in one possible switched circuit configuration is described. An H-bridge switched circuit 300, as may be used in a class D audio amplifier, is shown. H-bridge switched circuits 300 can also be used in motor drive circuits, power converters, or other switched circuits used to drive a load. Although particular examples of switched circuits are discussed herein utilize H-bridge configurations, these teachings are not limited to use with H-bridge switched circuits, and may be adapted to use with any switched circuit. For example, these teachings may be used with: full and half-bridge switched circuits; class D, class E, class F, class G, and class H amplifiers; amplifiers and other circuits utilizing pulse width modulation, pulse density modulation, pulse frequency modulation, delta-sigma modulation, variable structure control and/or sliding mode control; switched-mode power supplies and converters such as buck and boost converters and charge pumps; and circuits utilizing synchronous rectification. These teachings may be utilized in essentially any circuit switched circuit, possibly where it may be desired to control and vary the overlap of switch operations, (for example, where one switch is engaging and another is disengaging).

Referring again to the example in FIG. 3, the H-bridge switched circuit 300 is configured to drive a bridge-tied load 302. The Output P 304 side of the load 302 may be connected to PVDD 306 through switch S1 308 and to Ground 310 through switch S3 312. Similarly, Output M 314 side of the load 302 may be connected to PVDD 306 through switch S2 316 and to Ground 310 through switch S4 318. Switch Shunt 320 is connected across the load 302 between Output P 304 and Output M 314.

The H-bridge switched circuit 300 is not limited to use with any particular modulation scheme to control the gate drive signals, and all possible modulation schemes are not discussed in detail herein. In one particular example, however, the H-bridge switched circuit 300 employs a pulse-width modulation (PWM) BD modulation scheme. In operation, current is made to flow through the load 302 from Output P 304 to Output M 314 by closing switches S1 308 and S4 318 and opening switches S2 316 and S3 312. Current is made to flow through the load 302 from Output M 314 to Output P 304 by closing switches S2 316 and S3 312 and opening switches S1 308 and S4 318. When all four switches S1-S4 (308, 316, 312, 318) are opened during various states of the modulation scheme, both the Output P 304 and Output M 314 may be left floating, or possibly biased to the midsupply voltage by biasing circuits (not shown).

Because the load 302 may have some inherent inductance, it may resist changes in current. Thus, when switching from one state to another, the inductance of the load 302 briefly attempts to maintain the current previously flowing through the load 302. For example, given a PWM BD modulation scheme, one particular state has current flowing through the load 302 from Output P 304 to Output M 314 with switches S1 308 and S4 318 closed and switches S2 316 and S3 312 open. When transitioning to the next state, switches S1 308 and S4 318 are opened, but the inductance of the load 302 keeps the current flowing from Output P 304 to Output M 314. In a conventional H-bridge amplifier, this would remove charge from Output P 304 and deposit it on Output M 314, possibly raising the voltage of Output M 314 until it reaches one diode drop above VDD 306. At that point, a parasitic diode in switch S2 316 (or possibly elsewhere in the switched circuit) may clamp Output M 314 at a voltage of one diode drop above VDD 306 and dump current into VDD 306 from Output M 314. This fly-back current from Output M 314 to VDD 306 may cause a current spike on the power supply pins outside of the integrated circuit housing the H-bridge switched circuit 300, leading to undesirable EMI.

In one particular example, a shunt switch 320 is connected in parallel with the load 302 between Output P 304 and Output M 314 to prevent this fly-back current. When some of the switches S1-S4 (308, 316, 312, 318) are being opened and none of the switches S1-S4 (308, 316, 312, 318) are left closed, the shunt switch 320 is closed to recirculate and capture the inductive current through the load 302. For example, as switches S1 308 and S4 318 are being opened, the shunt switch 320 is closed so that the inductive continuation of the current through the load 302 circulates from Output P 304 through the load 320 to Output M 314 and back through the shunt switch 320 to Output P 304. This prevents the voltage of Output P 304 and Output M 314 from substantially changing due to the inductance of the load 302 during the transition from one state of operation to another.

Unlike typical Class-D switching schemes that include a dead-time (also known as a "break-before-make" scheme) to prevent against shoot-through currents, the switching scheme according to one particular example uses a negative dead-time or overlap when switching from the driven state to the shunt state, and vice versa. This helps prevent the outputs Output P 304 and Output M 314 from flying to the supply rails VDD 306 and Ground 310 due to the inductive current of the load 302, thereby shooting past the midsupply level instead of settling there. In the shunt-to-driven transition, smooth transitions on the outputs Output P 304 and Output M 314 may be achieved by using switches with overlapping transitions to prevent current spikes to the supply rails VDD 306 and Ground 310 and to avoid turning on the parasitic diodes associated with the switches S1-S4 (308, 316, 312, 318) or elsewhere in the switched circuit.

Figure 4:
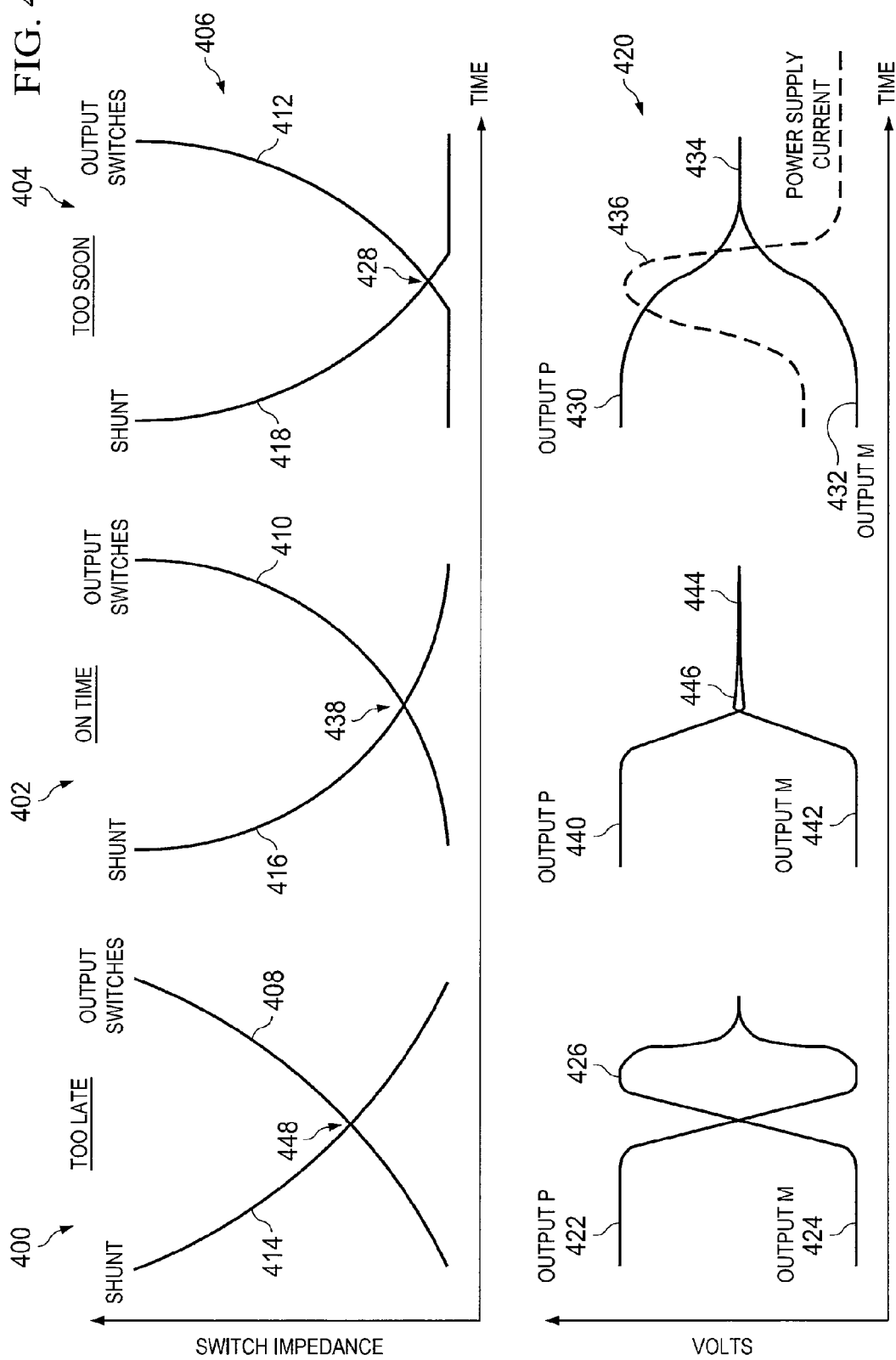
FIG. 4 comprises graphs of output power in voltage as compared against switch impedances in different timing configurations.

Turning now to FIG. 4, the timing of transitions from the driven state and the shunt state will be discussed in more detail. The desired overlapping of switch transitions is illustrated in the three cases 400, 402, and 404, each of which illustrates a different overlap during the driven-to-shunt transition. The top row of curves 406 represents switch impedance versus time during the transition, with the rising impedance curves 408, 410, and 412 corresponding to the output switches S1-S4 (308, 316, 312, 318) and the falling impedance curves 414, 416, and 418 corresponding to the shunt switch 320. The bottom row of curves 420 shows the corresponding transition of the output voltages (at Output P 304 and Output M 314) versus time. In the first case 400, the shunt switch 320 is turned on too late. As switches S1 308 and S4 318 are turned off (opened), the impedance 408 of the combined closing switches S1 308 and S4 318 increases, the Output P voltage 422 begins to drop, and the Output M voltage 424 begins to rise. The resulting drop in the current through switches S1 308 and S4 318 and the load 302 is resisted by the inductance of the load 302, which continues to drive current through the load 302 from Output P 304 to Output M 314, taking electrical charge from Output P 304 and depositing it on Output M 314. As the shunt switch 320 begins to close, the impedance 414 of the shunt switch 320 begins to fall. If the shunt switch 320 does not close early enough to recirculate substantially all of the inductive current through the load 302, the fly-back current through the load 302 can cause the voltage on Output M 314 to rise to a voltage level 426 of one diode drop above VDD 306 when the parasitic diode in switch S2 316 (or possibly elsewhere in the switched circuit) turns on and dumps charge into VDD 306 from Output M 314. This dumping of current into the supply rails causes undesirable EMI.

If the shunt switch 320 closes too soon during the transition as illustrated in the right column 404 of FIG. 4, the combined impedance 428 of switches S1 308 and S4 318 (impedance 412) and the shunt switch 320 (impedance 418) is very low, creating a near short circuit between VDD 306 and Ground 310. Although the Output P voltage 420 and Output M voltage 432 center at a mid-supply level 434 with the help of biasing circuits (not shown), the near short circuit between VDD 306 and Ground 310 leads to a spike in the power supply current 436, again causing undesirable EMI, and can dominate the quiescent current of the system as a whole in low power applications where often it is desired to keep quiescent current to a minimum.

An example of possible desired transition timing between the driven state and the shunt state is illustrated in the center column 402 of FIG. 4. The opening of switches S1 308 and S4 318 and the closing of the shunt switch 320 are overlapped so that the increasing impedance 410 of switches S1 308 and S4 318 intersects with the decreasing impedance 416 of the shunt switch 320 at a desired impedance level 438. This desired impedance level 438 is substantially the same as the impedance of the load 302, and causes substantially all of the inductive current through the load 302 to be recirculated through the shunt switch 320. As the voltage 440 of Output P 304 drops and the voltage 442 of Output M 314 rises, the shunt switch 320 catches and recirculates the inductive current through the load 302 so that Output P 304 and Output M 314 settle at a mid-supply voltage level 444. Although a minor amount of voltage overshoot 446 may occur, fly-back and shoot-through current is minimized, greatly reducing EMI.

As power output levels change, however, there may exist a desire to vary the delay of one switch's turning on as compared to another switch's turning off (or vise-versa), thus varying the amount of overlap that exists during these switch transitions. As the delay time increases (making for a shorter overlap), the impedance overlap between the transitioning switches occurs at a higher impedance (as shown in FIG. 4 at 448) than if the delay time is shorter (longer overlap time, shown at 428). As a result of the higher impedance overlap, shoot-through current will be lower.

Particularly, in one example, it may be desired to reduce shoot-through current at lower power levels while limiting fly-back voltage at higher power levels. The required amount of overlap may be greater (shorter delay) at higher power levels to effectively limit fly-back voltage, while a lesser overlap (longer delay) may do the same for lower power levels. The longer overlap (used by higher power levels) when used at lower power levels may allow for more shoot-through current than may be desired, and may even dominate the quiescent current of a lower power application. Implementation of a controlled delay (and thus controlled overlap) between transitions based on output power can thus improve performance.

Figure 5:
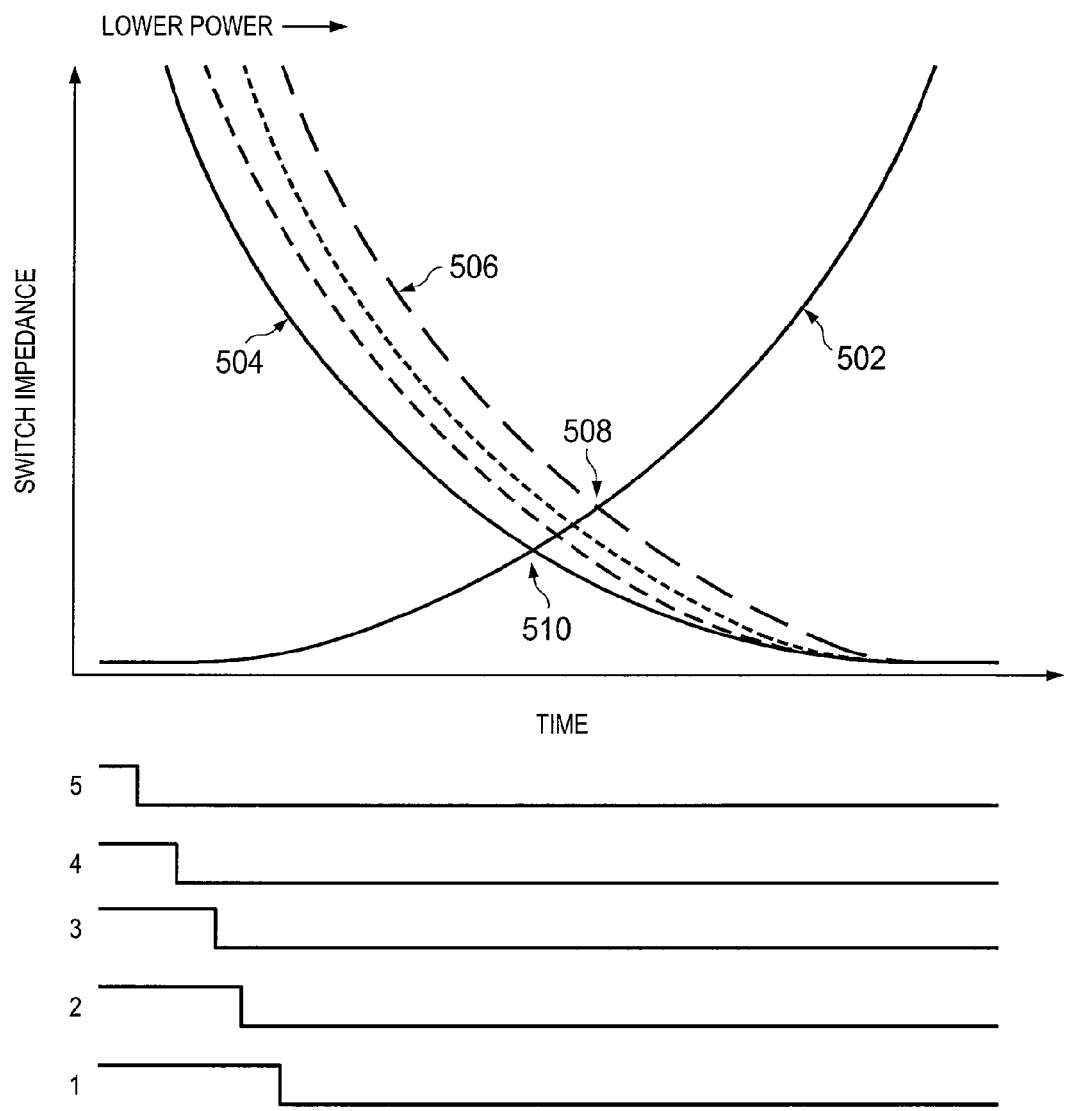
FIG. 5 comprises a graph showing output switch impedance curves as influenced by switch timing as configured in accordance with various embodiments of the invention.

An effect of the variable delay is shown in more detail in FIG. 5. As one switch begins its impedance transition from low to high (is turned off), as shown by impedance curve 502, another switch may begin its impedance transition from high to low (is turned on), as shown by impedance curve 504. As the power level lowers, the delay increases, and the impedance transition begins later, as shown by impedance curve 506. The impedance overlap then occurs at a higher impedance when the delay is longer 508 than when the delay is shorter 510. This higher impedance overlap operates to reduce shoot-through current at the lower power level.

As noted above, it may be beneficial to alter the switch delay based on power levels. Referring again to the example of FIG. 1, the control signal 108 reflects a power level of operation for the switched circuit. In another example, the control signal further comprises at least one indicator reflecting a comparison of an input pulse modulated signal controlling power for the switched circuit to a reference pulse modulated signal.

Figure 6:
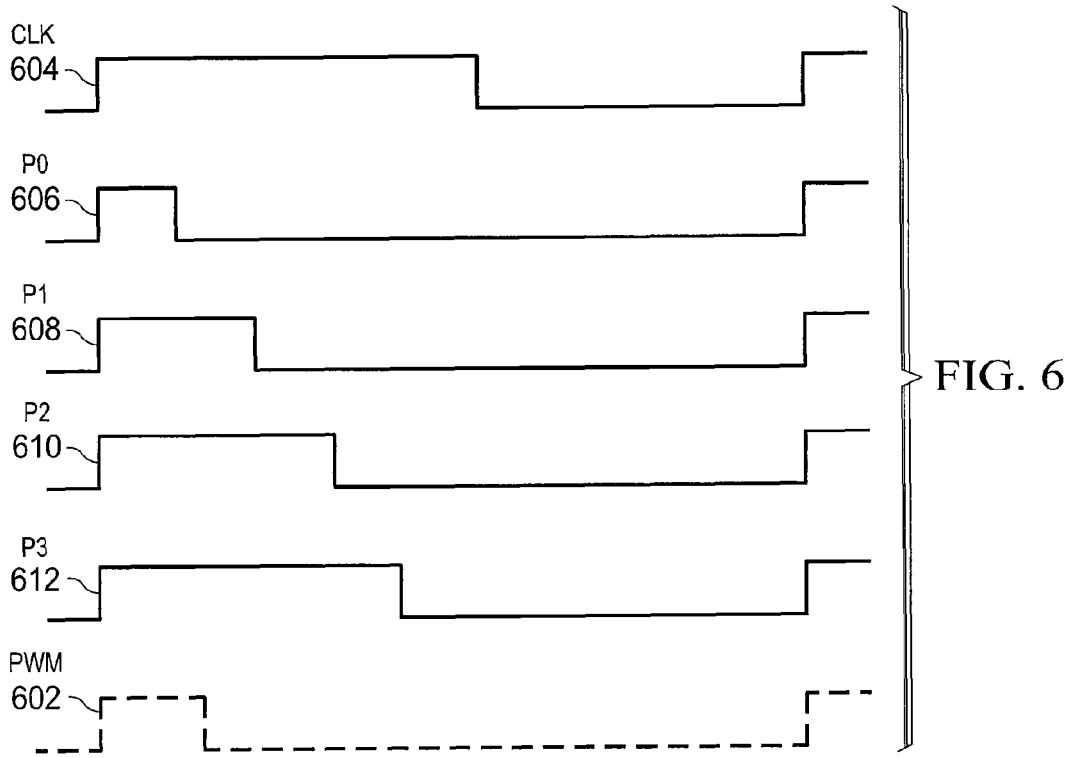
FIG. 6 comprises a timing diagram as configured in accordance with various embodiments of the invention.

Referring now to FIG. 6, an example of this comparison is described. The input PWM signal that controls power for the switched circuit is shown at 602. In addition to the clock signal 604, there are four pulse width signals P0 606, P1 608, P2 610, and P3 612 that correspond to four power levels. A comparison between the PWM signal 602 and the four pulse width signals P0-P3 606-612 can be executed such that an output is generated as the control signal 108 to represent the smallest pulse width signal P0-P3 606-612 that is larger than the PWM signal 602. As shown in FIG. 6, the example PWM signal 602 is narrower than P1 608, but wider than P0 606, yielding a value corresponding to power level P1 608 to be output on the control signal 108.

By one example, the control signal 108 may comprise binary signals representing these four power levels (for instance, P0='00', P1='01', etc.). In the above example, a value of '01' representing P1 608 would then be output on the control signal 108. One skilled in the art will understand that any number of different pulse width signals and output values may exist, and that these teachings are adjustable and expandable to suit any required or desired level of power level reflection granularity.

Referring again to FIG. 1, the control signal 108 is input to the circuits 102, 114, and optionally 146. By one example, the first circuit 102 will provide the first timing signal 110 from the last operated switch of the first switch set 128 when the control signal 108 indicates a lowest power level for the switched circuit. By this example, a maximum delay (maximal overlap) is imparted on the second switch controller 112, allowing for a higher impedance overlap, lowering shoot-through current. Conversely, and by another example, the first circuit 102 will provide the first timing signal from the first operated switch of the first switch set 128 when the control signal 108 indicates a highest power level for the switched circuit. By this example, a minimal delay (minimal overlap) is imparted on the second switch controller 112, allowing for a lower impedance overlap, limiting fly-back voltage.

Figure 7:
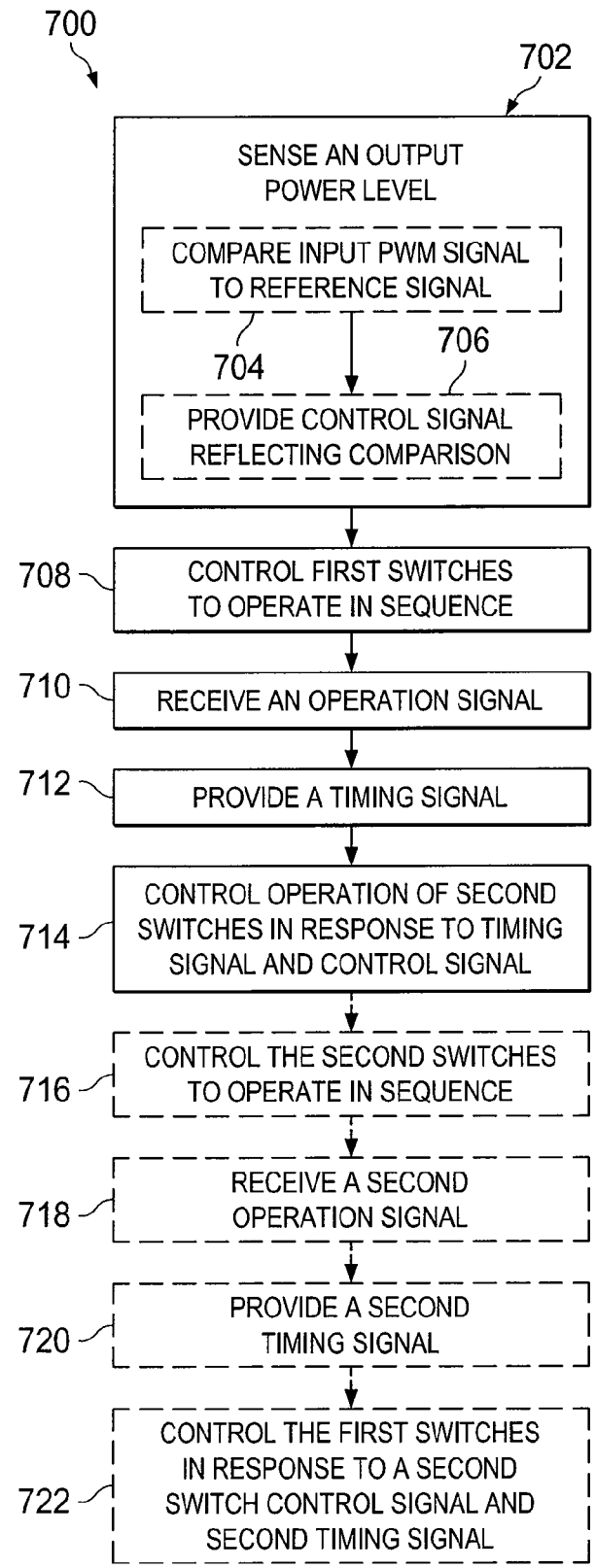
FIG. 7 comprises a flow diagram as configured in accordance with various embodiments of the invention.

Referring now to FIG. 7, an example method 700 of controlling switch timing in a switched circuit corresponding to the previously discussed apparatus is now discussed. This method 700 can provide for sensing 702 an output power level of the switched circuit so as to provide a control signal. Optionally, the sensing 702 may further comprise comparing 704 an input pulse modulated signal controlling power for the switched circuit to at least one reference pulse modulation signal and providing 706 the control signal via at least one indicator reflecting a comparison of the input pulse modulated signal and the at least one reference pulse modulated signal. The method 700 also includes controlling 708, by a first switch controller, a first set of switches to operate in a sequence via a plurality of operation signals corresponding to switches of the first set of switches. The method further comprises receiving 710, by a multiplexer, at least one of the plurality of operation signals and providing 712 a timing signal from the multiplexer. Here, the timing signal responds to at least one of the plurality of operation signals, and the at least one operation signal is determined at least in part by the output power level of the switched circuit via the control signal at the multiplexer. The method also includes controlling 714 operation of a second set of switches in response to a switch control signal and the timing signal.

In another example, the method 700 further provides for controlling 716, by a second switch controller, the second set of switches to operate in a sequence via a second plurality of operation signals corresponding to switches of the second set of switches, and receiving 718, by a second multiplexer, at least one of the second plurality of operation signals. The method 700 also includes providing 720 a second timing signal from the second multiplexer, wherein the second timing signal responds to at least one of the second plurality of operation signals. Here, the at least one of the second plurality of operation signals is determined at least in part by the output power level of the switched circuit via the control signal at the second multiplexer. The method also includes controlling 722 operation of the first set of switches in response to a second switch control signal and the second timing signal.

As noted above, these teachings provide great flexibility with respect to the use of low-EMI switched circuits over a wide range of power outputs, and further provide increased scalability of low-EMI switched circuits for use with various output power levels, desired timing granularity, and output load characteristics. Those skilled in the art will note that due to this scalability, these teachings can provide for increased power efficiency, leading to less overall power consumption and increased battery life. Other benefits include decreased design time, elimination of additional components, and scalable part selection. For example, a design engineer can utilize these teachings to eliminate external component, pass EMI requirements, and readily utilize a familiar system over a wide range of design requirements, delivering both a cost savings and time savings to design projects and end product delivery.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. For example, these teachings can be readily applied to any switched circuit where variable timing of operation of multiple switches may be desired, and are not limited to the H-bridge switched circuit described herein. Also, these teachings may be utilized with any number of switches within one or more switched circuits.

We claim:

1. An apparatus for controlling timing of switch operation in a switched circuit, the apparatus comprising:
    a first switch controller having a plurality of first switch controller outputs, wherein the first switch controller is configured to receive a first switch controller control signal and a second timing signal and is configured to control operation of at least one switch of a first switch set in the switched circuit according to a function of the second timing signal and the first switch controller control signal via at least one of the first switch controller outputs;
    a second switch controller having a plurality of second switch controller outputs, wherein the second switch controller is configured to receive a second switch controller control signal and a first timing signal and is configured to control operation of at least one switch of a second switch set in the switched circuit according to a function of the first timing signal and the second switch controller control signal via at least one of the second switch controller outputs;
    a first circuit coupled to at least one of the first switch controller outputs of the first switch controller and configured to receive a control signal to provide the first timing signal to the second switch controller according to a function of the control signal such that the first timing signal is determined by the first circuit in response to at least one of the first switch controller outputs; and
    a second circuit coupled to at least one of the second switch controller outputs of the second switch controller and configured to receive the control signal to provide the second timing signal to the first switch controller according to a function of the control signal such that the second timing signal is determined by the second circuit in response to at least one of the second switch controller outputs.

2. The apparatus of claim 1 wherein the first switch controller is configured to operate the first set of switches in a sequence.

3. The apparatus of claim 1 wherein the second switch controller is configured to operate the second set of switches in a sequence.

4. The apparatus of claim 1 wherein the apparatus further comprises a third switch controller having a plurality of third switch controller outputs, wherein the third switch controller is configured to control operation of at least one switch of a third switch set in the switched circuit via at least one of the third switch controller outputs, and wherein the third switch controller is configured to operate the third set of switches in a sequence.

5. The apparatus of claim 4 wherein the third switch controller is configured to receive a third switch controller control signal and at least one of the first or second timing signals and is configured to control operation of the at least one switch of the third switch set according to a function of the at least one of the first or second timing signals and the third switch controller control signal.

6. The apparatus of claim 1 wherein the first circuit further comprises a first multiplexer having a plurality of first multiplexer inputs, wherein at least one of the first multiplexer inputs is coupled to at least one of the first switch controller outputs, and the first timing signal is provided from one of the plurality of first multiplexer inputs according to the control signal.

7. The apparatus of claim 6 wherein the function of the control signal further comprises providing the first timing signal from a last operated switch of the first switch set when the control signal indicates a lowest power level for the switched circuit.

8. The apparatus of claim 1 wherein the second circuit comprises a second multiplexer having a plurality of second multiplexer inputs, wherein at least one of the second multiplexer inputs is coupled to at least one of the second switch controller outputs, and the second timing signal is provided from one of the plurality of second multiplexer inputs according to the control signal.

9. The apparatus of claim 1 wherein the control signal reflects a power level of operation for the switched circuit.

10. The apparatus of claim 1 wherein the control signal further comprises at least one indicator reflecting a comparison of an input pulse modulated signal controlling power for the switched circuit to a reference pulse modulated signal.

11. The apparatus of claim 1 wherein the apparatus further comprises an AND gate that is configured to receive the first switch controller control signal and the second timing signal and that is configured to provide an input signal to the first switch controller.

12. The apparatus of claim 1 wherein the switched circuit further comprises an H-bridge in a class D audio amplifier.

13. A method of controlling switch timing in a switched circuit comprising:
sensing an output power level of the switched circuit so as to provide a control signal;
controlling, by a first switch controller, a first set of switches to operate in a sequence via a plurality of operation signals corresponding to switches of the first set of switches;
receiving, by a multiplexer, at least one of the plurality of operation signals;
providing a timing signal from the multiplexer, wherein the timing signal responds to at least one of the plurality of operation signals, wherein the at least one operation signal is determined at least in part by the output power level of the switched circuit via the control signal at the multiplexer; and
controlling operation of a second set of switches in response to a switch control signal and the timing signal.

14. The method of claim 13 wherein the method further comprises:
controlling, by a second switch controller, the second set of switches to operate in a sequence via a second plurality of operation signals corresponding to switches of the second set of switches;
receiving, by a second multiplexer, at least one of the second plurality of operation signals;
providing a second timing signal from the second multiplexer, wherein the second timing signal responds to at least one of the second plurality of operation signals, wherein the at least one of the second plurality of operation signals is determined at least in part by the output power level of the switched circuit via the control signal at the second multiplexer; and
controlling operation of the first set of switches in response to a second switch control signal and the second timing signal.

15. The method of claim 13, wherein the step of sensing an output power level of the switched circuit to provide a control signal further comprises:
comparing an input pulse modulated signal controlling power for the switched circuit to at least one reference pulse modulated signal; and
providing the control signal via at least one indicator reflecting a comparison of the input pulse modulated signal and the at least one reference pulse modulated signal.

16. An apparatus for controlling timing of switch operation in an H-bridge switched circuit in a Class D audio amplifier, the apparatus comprising:
a first switch controller having a plurality of first switch controller outputs, wherein the first switch controller is configured to receive a first timing-influenced switch controller control signal and is configured to control operation of at least one switch of a first switch set in the H-bridge switched circuit according to the first timing-influenced switch controller control signal via at least one of the first switch controller outputs, wherein the first switch controller is configured to operate the first set of switches in a first sequence;
a second switch controller having a plurality of second switch controller outputs, wherein the second switch controller is configured to receive a second timing-influenced switch controller control signal and is configured to control operation of at least one switch of a second switch set in the H-bridge switched circuit according to the second timing-influenced switch controller control signal via at least one of the second switch controller outputs, wherein the second switch controller is configured to operate the second set of switches in a second sequence;
a first multiplexer having a plurality of first multiplexer inputs, wherein at least one of the first multiplexer inputs is coupled to at least one of the first switch controller outputs, and wherein the first multiplexer is configured to receive a control signal and is configured to provide a first timing signal according to a function of the control signal such that the first timing signal is provided from at least one of the plurality of first multiplexer inputs according to the control signal that reflects a comparison of an input pulse modulated signal controlling power for the H-bridge switched circuit to at least one reference pulse modulated signal;
a second multiplexer having a plurality of second multiplexer inputs, wherein at least one of the second multiplexer inputs is coupled to at least one of the second switch controller outputs, wherein the second multiplexer is configured to receive the control signal and is configured to provide a second timing signal according to a function of the control signal such that the second timing signal is provided from at least one of the plurality of second multiplexer inputs according to the control signal;
a first AND gate configured to receive a first switch controller control signal and the second timing signal to provide the first timing-influenced switch controller control signal; and
a second AND gate configured to receive a second switch controller control signal and the first timing signal to provide the second timing-influenced switch controller control signal.

17. The apparatus of claim 16 wherein the apparatus further comprises:
a third switch controller having a plurality of third switch controller outputs, wherein the third switch controller is configured to receive a third timing-influenced switch controller control signal and is configured to control operation of at least one switch of a third switch set in the H-bridge switched circuit according to the third timing-influenced switch controller control signal via at least one of the third switch controller outputs, wherein the third switch controller is configured to operate the third set of switches in a third sequence;
a third multiplexer having a plurality of third multiplexer inputs, wherein at least one of the third multiplexer inputs is coupled to at least one of the third switch controller outputs, wherein the third multiplexer is configured to receive the control signal and is configured to provide a third timing signal according to a function of the control signal such that the third timing signal is provided from at least one of the plurality of third multiplexer inputs according to the control signal; and
a third AND gate configured to receive a third switch controller control signal and at least one of the first timing signal or the second timing signal to provide the third timing-influenced switch controller control signal.

18. The apparatus of claim 17 wherein the first AND gate is further configured to receive the first controller control signal and at least one of the second timing signal or the third timing signal to provide the first timing-influenced switch controller control signal.

19. The apparatus of claim 16 wherein the function of the control signal further comprises providing the first timing signal from a last operated switch of the second set of switches when the control signal indicates a lowest power level of the H-bridge switched circuit.

* * * * *